(12) United States Patent  
Allen et al.

(10) Patent No.: US 8,855,270 B2  
(45) Date of Patent: Oct. 7, 2014

(54) ANTIWETTING COATING FOR LIQUID METAL BEARING AND METHOD OF MAKING SAME

(75) Inventors: Donald Robert Allen, Waukesha, WI (US); Michael John Danyluk, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 346 days.

(21) Appl. No.: 13/412,712

(22) Filed: Mar. 6, 2012

(65) Prior Publication Data

US 2013/0235978 A1 Sep. 12, 2013

(51) Int. Cl.
*H01J 35/02* (2006.01)

(52) U.S. Cl.
USPC ......... 378/133; 378/132; 384/322; 427/419.2

(58) Field of Classification Search
USPC ........ 378/132, 133; 384/322; 427/419.2, 539, 427/598

See application file for complete search history.

(56) References Cited

U.S. PATENT DOCUMENTS

| 4,690,871 A | 9/1987 | Gordon |
| 5,175,126 A | 12/1992 | Ho et al. |
| 5,858,184 A | 1/1999 | Fu et al. |
| 2009/0035213 A1 | 2/2009 | Takayasu et al. |

*Primary Examiner* — Jurie Yun

(74) *Attorney, Agent, or Firm* — Ziolkowski Patent Solutions Group, SC

(57) ABSTRACT

An x-ray tube includes a frame enclosing a high vacuum, a cathode positioned within the enclosure, a bearing assembly a stationary component comprised of a first base substrate, the first base substrate having a first surface, a rotatable component comprised of a second base substrate, the second base substrate having a second surface, wherein the rotatable component is positioned proximate the stationary component such that a gap is formed between the first surface and the second surface, a liquid metal positioned within the gap, and an antiwetting coating attached to at least one of the first surface and the second surface, the coating includes titanium nitride attached to the at least one of the first surface and the second surface, and an oxide of titanium attached to the titanium nitride.

20 Claims, 4 Drawing Sheets

ANTIWETTING COATING FOR LIQUID METAL BEARING AND METHOD OF MAKING SAME

BACKGROUND OF THE INVENTION

The invention relates generally to x-ray tubes and, more particularly, to an antiwetting coating for a liquid metal bearing in an x-ray tube and a method of making same.

X-ray systems typically include an x-ray tube, a detector, and a bearing assembly to support the x-ray tube and the detector. In operation, an imaging table, on which an object is positioned, is located between the x-ray tube and the detector. The x-ray tube typically emits radiation, such as x-rays, toward the object. The radiation typically passes through the object on the imaging table and impinges on the detector. As radiation passes through the object, internal structures of the object cause spatial variances in the radiation received at the detector. The detector then emits data received, and the system translates the radiation variances into an image, which may be used to evaluate the internal structure of the object. One skilled in the art will recognize that the object may include, but is not limited to, a patient in a medical imaging procedure and an inanimate object as in, for instance, a package in a computed tomography (CT) package scanner.

X-ray tubes include a rotating anode structure for distributing the heat generated at a focal spot. The anode is typically rotated by an induction motor having a cylindrical rotor built into a cantilevered axle that supports a disc-shaped anode target and an iron stator structure with copper windings that surrounds an elongated neck of the x-ray tube. The rotor of the rotating anode assembly is driven by the stator. An x-ray tube cathode provides a focused electron beam that is accelerated across a cathode-to-anode vacuum gap and produces x-rays upon impact with the anode. Because of the high temperatures generated when the electron beam strikes the target, it is typically necessary to rotate the anode assembly at high rotational speed. This places stringent demands on the bearing assembly, which typically includes tool steel ball bearings and tool steel raceways positioned within the vacuum region, thereby requiring lubrication by a solid lubricant such as silver. Wear of the silver and loss thereof from the bearing contact region increases acoustic noise and slows the rotor during operation.

In addition, the operating conditions of newer generation x-ray tubes have become increasingly aggressive in terms of stresses because of G forces imposed by higher gantry speeds and higher anode run speeds. As a result, there is greater emphasis in finding bearing solutions for improved performance under the more stringent operating conditions.

A liquid metal bearing (i.e. a spiral groove bearing, or SGB) may be employed in lieu of ball bearings. Advantages of liquid metal bearings include a high load capability and a high heat transfer capability due to an increased amount of contact area as compared to a ball bearing. Advantages also include low acoustic noise operation. Gallium, indium, or tin alloys are typically used as the liquid metal, as they tend to be liquid at room temperature and have adequately low vapor pressure, at operating temperatures, to meet the rigorous high vacuum requirements of an x-ray tube.

Liquid metal bearings are typically fabricated having a small gap, up to a few hundred microns, formed between stationary components and rotating components. The liquid metal is positioned in the small gap and prevents direct metal-to-metal contact from occurring. Liquid metals typically used in an SGB tend to be highly reactive and corrosive. The liquid metal of an SGB may react with a base metal that it contacts, thus consuming the liquid metal and shortening the life of the SGB. The liquid metal is also prone to migration within the bearing and can readily migrate from its operating location in the small gap. If liquid metal migration is unchecked the SGB can become starved of liquid metal, which can lead to metal-to-metal contact between rotating and stationary components, causing early life failure.

As such, an SGB typically includes an antiwetting coating that is positioned on components to avoid liquid metal migration within the SGB. The antiwetting coating typically is a structure or compound that repels the liquid metal and prevents creepage and migration of the liquid metal. That is, the antiwetting coating prevents migration from the location within the SGB where it serves to maintain a separation between the stationary and rotating components. Known antiwetting coatings include $Ti_xO_y$ and $Al_2O_3$, which are more stable compounds than the liquid metals typically used in an SGB and are thus not prone to degradation due to contact with the liquid metal. However, $Ti_xO_y$ and $Al_2O_3$ are relatively soft materials that are vulnerable to damage during processing. If damage in the coating occurs the parts are typically re-processed, adding cost and time to the manufacturing process. If the damage is not detected it can lead to early life failure of the bearing.

Another known antiwetting coating includes TiN, which has a significantly greater hardness than, for instance, $Ti_xO_y$. The Mohs hardness of TiN is approximately 9 while that of $Ti_xO_y$ is approximately 5-6. As such, TiN can provide an effective antiwetting coating that is also scratch resistant and robust. However, TiN is prone to oxidation at elevated temperature, such as above 500° C. This oxidation can occur even during dry hydrogen firing if the dewpoint is not sufficiently low. Volatile $Ga_2O$ given off by the bearing has also been shown to cause oxidation of the TiN coated surfaces. As such, conversion of TiN to $Ti_xO_y$ can result in a material on the surface of the TiN that has a reduced hardness and drop in scratch resistance. That is, although TiN may be selected as an antiwetting coating because of its high hardness, such benefit can be lost if, during processing, oxidation of the TiN occurs.

Therefore, it would be desirable to design an x-ray tube with an SGB having a robust and high hardness coating that is not susceptible to oxidation.

BRIEF DESCRIPTION OF THE INVENTION

The invention provides an apparatus for improving an x-ray tube with a SGB bearing, that overcomes the aforementioned drawbacks.

According to one aspect of the invention, an x-ray tube includes a frame enclosing a high vacuum, a cathode positioned within the enclosure, a bearing assembly a stationary component comprised of a first base substrate, the first base substrate having a first surface, a rotatable component comprised of a second base substrate, the second base substrate having a second surface, wherein the rotatable component is positioned proximate the stationary component such that a gap is formed between the first surface and the second surface, a liquid metal positioned within the gap, and an antiwetting coating attached to at least one of the first surface and the second surface, the coating includes titanium nitride attached to the at least one of the first surface and the second surface, and an oxide of titanium attached to the titanium nitride.

In accordance with another aspect of the invention, a method of forming an antiwetting coating on a component of a spiral groove bearing includes depositing titanium nitride onto the component, and depositing titanium oxide onto the component after the titanium nitride has been deposited onto the component.

Yet another aspect of the invention includes a spiral groove bearing (SGB) includes a stationary component and a rotatable component each having a respective base substrate and each having a layer comprised of an outer surface layer of titanium oxide, and titanium nitride positioned between a surface of each base substrate and each respective outer layer of titanium oxide, wherein a gap is formed between the stationary component and the rotatable component, and a liquid metal positioned in the gap, wherein the liquid metal comprises one of gallium and an alloy of gallium.

Various other features and advantages of the invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
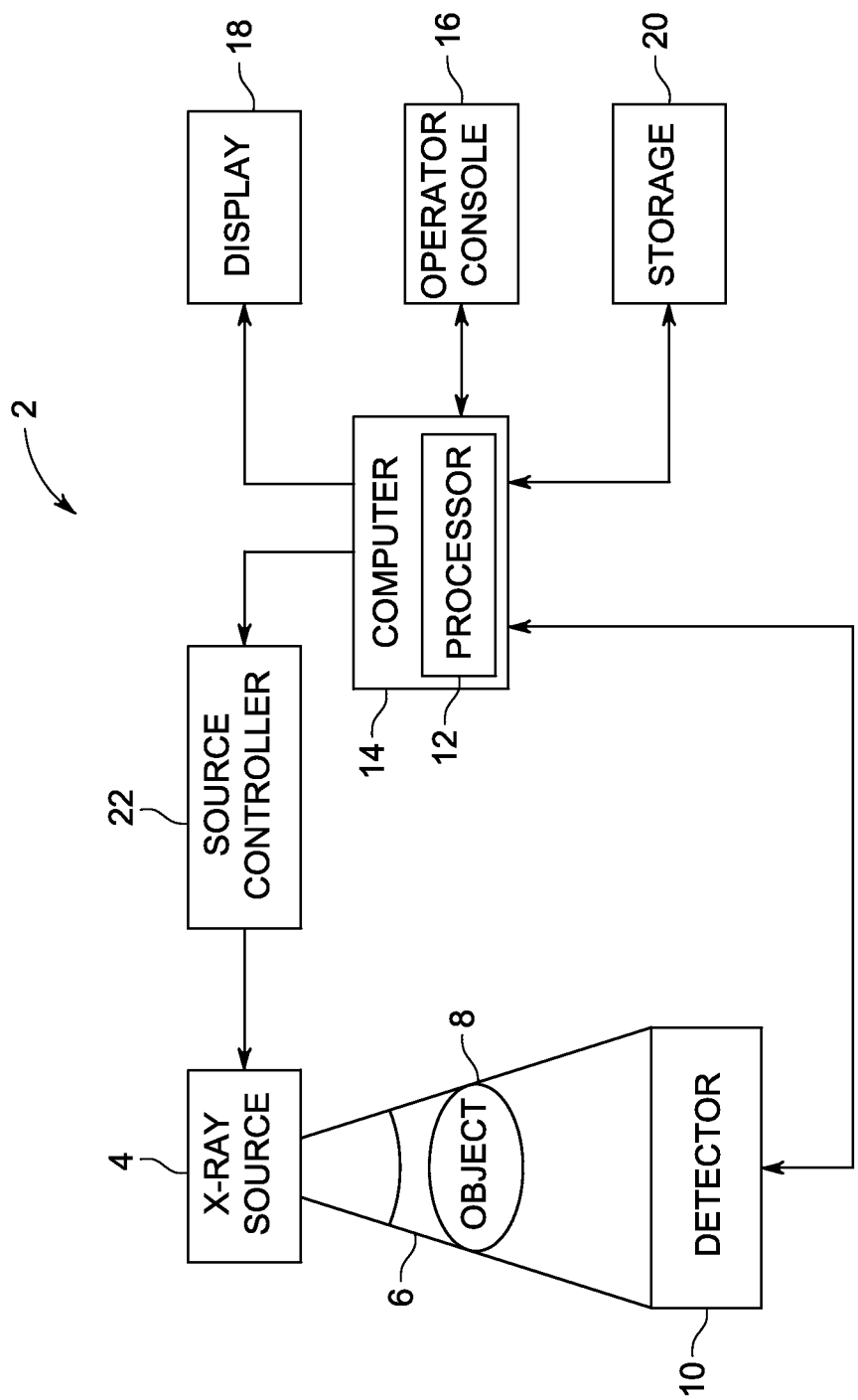
FIG. 1 is a block diagram of an imaging system that can benefit from incorporation of an embodiment of the invention.

FIG. 1 is a block diagram of an embodiment of an x-ray imaging system 2 designed both to acquire original image data and to process the image data for display and/or analysis in accordance with the invention. It will be appreciated by those skilled in the art that the invention is applicable to numerous medical imaging systems implementing an x-ray tube, such as x-ray or mammography systems. Other imaging systems such as computed tomography (CT) systems and digital radiography (RAD) systems, which acquire image three dimensional data for a volume, also benefit from the invention. The following discussion of imaging system 2 is merely an example of one such implementation and is not intended to be limiting in terms of modality.

As shown in FIG. 1, imaging system 2 includes an x-ray tube or source 4 configured to project a beam of x-rays 6 through an object 8. Object 8 may include a human subject, pieces of baggage, or other objects desired to be scanned. X-ray source 4 may be a conventional x-ray tube producing x-rays having a spectrum of energies that range, typically, from 30 keV to 200 keV. The x-rays 6 pass through object 8 and, after being attenuated by the object, impinge upon a detector 10. Each detector in detector 10 produces an analog electrical signal that represents the intensity of an impinging x-ray beam, and hence the attenuated beam, as it passes through the object 8. In one embodiment, detector 10 is a scintillation based detector, however, it is also envisioned that direct-conversion type detectors (e.g., CZT detectors, etc.) may also be implemented.

A processor 12 receives the signals from the detector 10 and generates an image corresponding to the object 8 being scanned. A computer 14 communicates with processor 12 to enable an operator, using operator console 16, to control the scanning parameters and to view the generated image. That is, operator console 16 includes some form of operator interface, such as a keyboard, mouse, voice activated controller, or any other suitable input apparatus that allows an operator to control the imaging system 2 and view the reconstructed image or other data from computer 14 on a display unit 18. Additionally, operator console 16 allows an operator to store the generated image in a storage device 20 which may include hard drives, flash memory, compact discs, etc. The operator may also use operator console 16 to provide commands and instructions to computer 14 for controlling a source controller 22 that provides power and timing signals to x-ray source 4.

Figure 2:
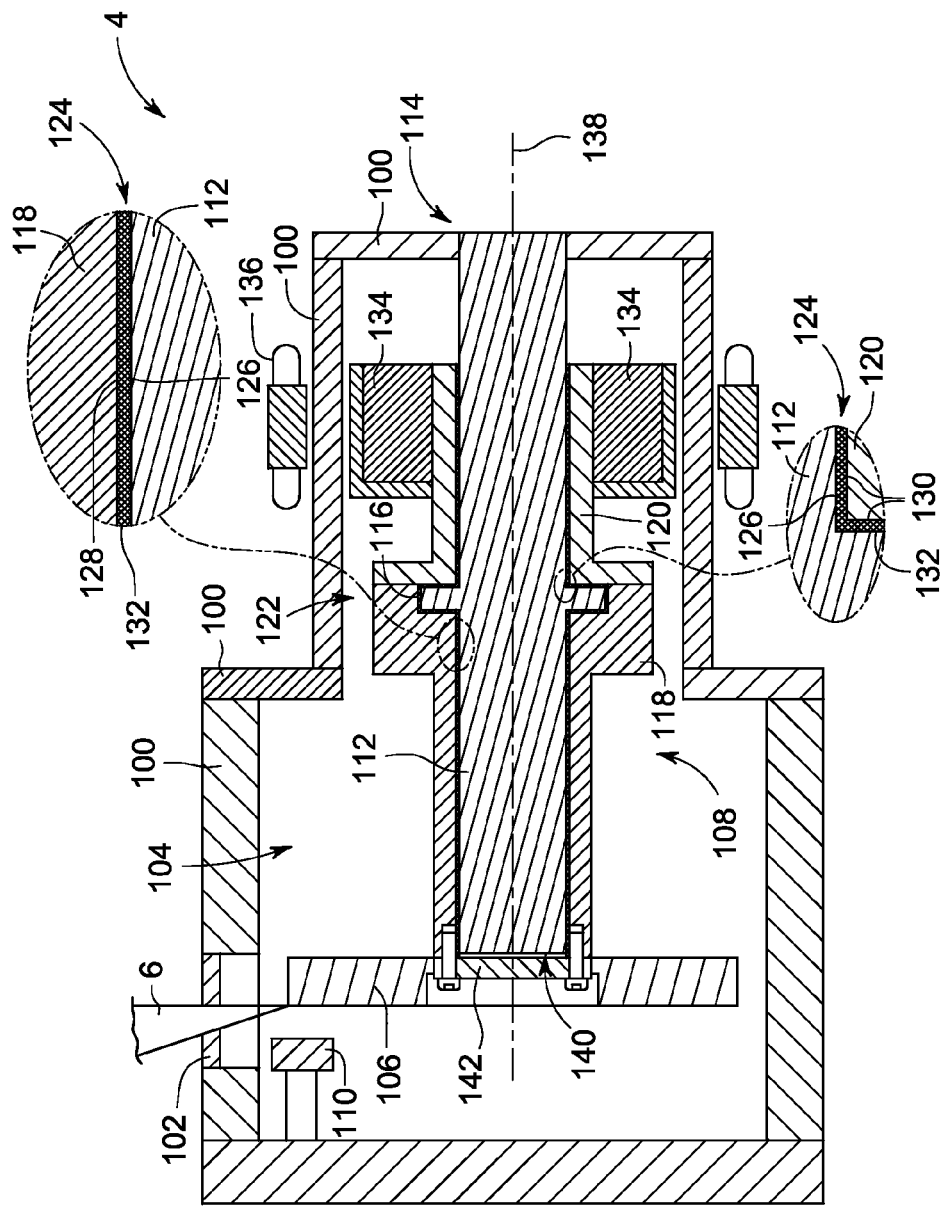
FIG. 2 illustrates a cross-sectional view of an x-ray tube according to an embodiment of the invention.

FIG. 2 illustrates a cross-sectional view of x-ray tube or source 4 incorporating embodiments of the invention. The x-ray source 4 includes a frame 100 having a radiation emission passage 102 therein that allows x-rays 6 to pass therethrough. Frame 100 encloses an x-ray tube volume 104, which houses a target or anode 106, a spiral groove bearing (SGB) assembly 108, and a cathode 110. The SGB 108 includes a center shaft, column, or center mount structure 112 that is configured to be attached to frame 100 at attachment point 114. In one embodiment, center shaft 112 includes a radial projection 116 that is configured to axially limit the motion or translation of first and second sleeves 118, 120. The SGB 108 includes a rotatable mount structure that includes first sleeve 118 and second sleeve 120 that are separable at separation location 122 to facilitate assembly and disassembly of SGB 108. SGB 108 includes a gap 124 formed between an outer surface 126 of center shaft 112 and an inner surface 128 of first sleeve 118. Similarly, gap 124 is formed between outer surface 126 of center shaft 112 and inner surfaces 130 of second sleeve 120. A liquid metal 132 is positioned within gap 130, and in embodiments of the invention, liquid metal 132 comprises gallium, tin, indium, and alloys thereof, as examples. SGB 108 includes a rotor 134 attached to second sleeve 120. A stator 136 is attached (attachment not shown) to frame 100 of x-ray tube 4.

Liquid metal 132 serves to support first sleeve 118, second sleeve 120, and target 106. Liquid metal 132 thereby functions as a lubricant between rotating and stationary components. In the embodiment illustrated, center shaft 112 is caused to be stationary with respect to frame 100, and target 106, first sleeve 118, and second sleeve 120 are caused to rotate about an axis of rotation 138 of x-ray tube 4. Thus, x-rays 6 are produced when high-speed electrons are suddenly decelerated when directed from cathode 110 to anode 106 via a potential difference therebetween of, for example, 60 thousand volts or more in the case of CT applications. The x-rays 6 are emitted through radiation emission passage 102 toward a detector array, such as detector 10 of FIG. 1. To avoid overheating anode 106 from the electrons, rotor 134 and sleeves 118, 120 rotate anode 106 at a high rate of speed about centerline 138 at, for example, 90-250 Hz.

However, because of the heating from x-ray generation in the anode 106, and because of self-heating of the liquid metal 132 in gap 124, the life of SGB 108 and therefore x-ray tube 4 in general may be limited because of the accelerating affects of high temperature of the reactive liquid metal. As such, SGB 108 may includes a hollow or cavity formed therein (not shown) for passage of liquid coolant therein. In operation, target 106 is caused to rotate about axis of rotation 138 via rotor 134, which is mechanically coupled thereto via first and second sleeves 118, 120. Cooling fluid, which may include a liquid such as dielectric oil, ethylene glycol, propylene glycol, and the like, or which may include a gas such as air, nitrogen, argon, and the like, is pressurized and caused to flow into the center of center shaft 112.

SGBs typically include angled grooves (not shown) for containing liquid metal therein and preventing loss of liquid metal from gaps such as gap 124 of SGB 108, as is commonly understood in the art. For instance, grooves may be positioned on outer surface 126 of center shaft 112, on inner surface 128 of first sleeve 118, on inner surfaces 130 of second sleeve 120, and on combinations thereof. Thus, though the grooves function to contain liquid metal 132 within gap 124, they do so at the expense of increased frictional heating within SGB 108 of liquid metal 132. Referring still to FIG. 2, it may be desirable to prevent flow of liquid metal into a gap 140 that is proximate where anode 106 is positioned near center shaft 112 and formed by cap 142, or in gap 124 proximate radial projection 116, as examples. Or, it may be desirable to limit flow of liquid metal within gap 124 along axial portions of first sleeve 118 and/or second sleeve 120. As such, in lieu of or in addition to providing angled grooves on components of SGB 108, antiwetting coatings are typically included, as stated above, in order to limit liquid metal migration within SGB 108. As stated, such known coatings may include $Ti_xO_y$, $Al_2O_3$, and TiN, but each is subject to damage or may be undesirable, in known applications, for reasons as stated above.

Figure 3:
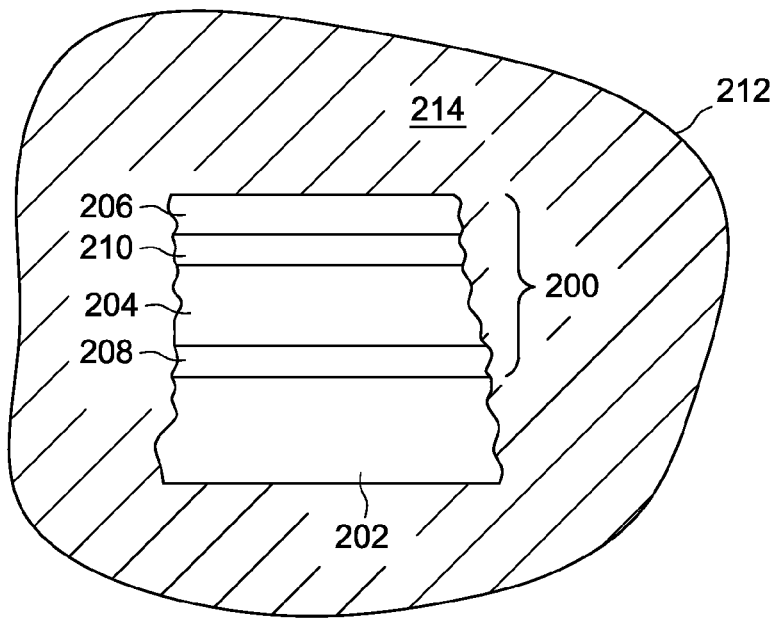
FIG. 3 illustrates a coating that includes at least a layer of titanium oxide on a base substrate and a layer of titanium nitride on the layer of titanium oxide, according to an embodiment of the invention.

Thus, according to embodiments of the invention, an improved antiwetting coating may be applied in regions within an SGB where it is desirable to limit liquid metal migration. Referring now to FIG. 3, a coating 200 is deposited onto a base substrate 202 according to an embodiment of the invention. According to this embodiment, coating 200 includes at least a layer of titanium nitride (TiN) 204 and a layer of titanium oxide 206, expressed in the general chemical form: $Ti_xO_y$, where subscripts x and y are typically whole numbers that may be varied depending on the composition of the layer or portions of the layer. That is, $Ti_xO_y$ may be generally referred to as titanium oxide but may encompass any general chemical structure that includes titanium and oxygen as primary constituent components, regardless of incidental contaminants or additional elements or materials that may be present therein. Similarly, TiN may be generally referred to as titanium nitride but may encompass any general chemical structure that includes titanium and nitrogen as primary constituent components, regardless of incidental contaminants or additional elements or materials that may be present therein.

According to the invention, referring still to FIG. 3, antiwetting coating 200 is positioned on any of the surfaces within SGB 108 and within gaps 124, 140 formed between rotatable and stationary surfaces where it is desirable to limit liquid metal migration and leakage. According to the invention, coating 200 may be positioned on one or both opposing surfaces where it is desirable to limit migration. That is, coating 200 may be positioned on select areas of any of the components to include center shaft 112, sleeves 118, 120, and cap 142. According to this embodiment, the SGB components include a base material of molybdenum. Thus, referring to FIG. 3, base substrate 202 is molybdenum according to this embodiment and may include any of the components of SGB listed herein. That is, any of components 112, 118, 120, and 142 may include coating 200 having at least a first layer of titanium nitride 204 and a second layer of titanium oxide 206, as illustrated in FIG. 3.

Figure 4:
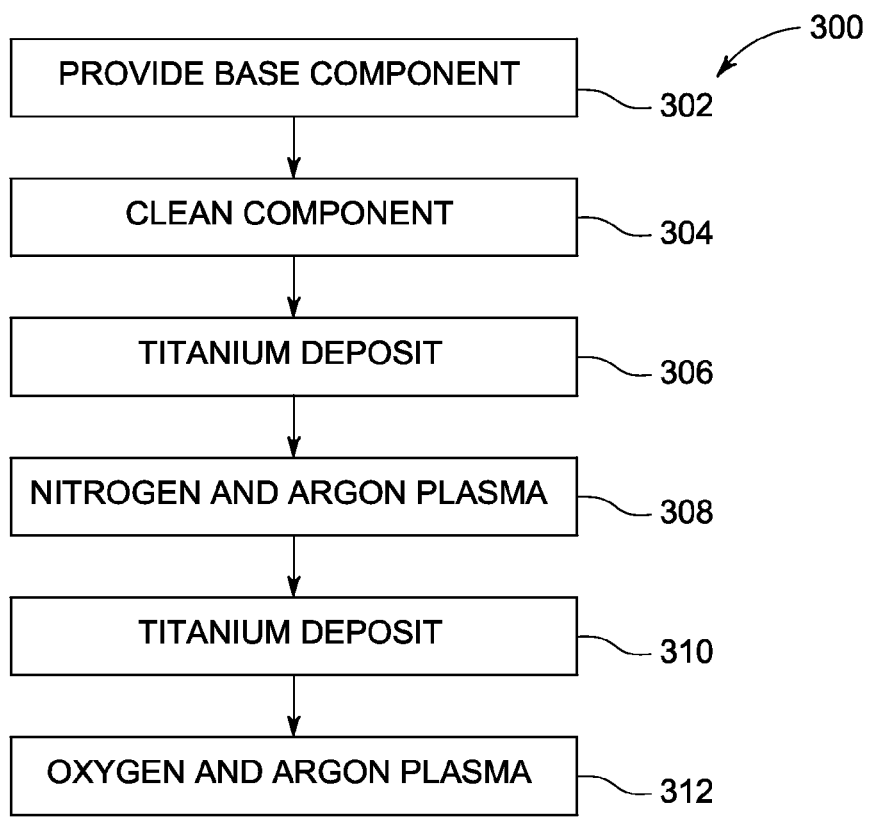
FIG. 4 illustrates steps in a coating process for applying the coating illustrated in FIG. 3.

According to the invention, coating 200 may include additional and optional layers of titanium. That is, depending on how coating 200 is fabricated, coating 200 may include a first titanium layer 208 and/or a second titanium layer 210. First and second titanium layers 208, 210 may or may not therefore be included in embodiments of the invention. According to one embodiment, coating 200 is fabricated according to process steps that are illustrated in FIG. 4. Typically, the process steps of FIG. 4 are implemented by placing a component or components into a plasma chamber or magnetron 212 in order to present a vacuum environment 214 in which parts may be coated, according to the invention.

Referring to FIG. 4, coating process 300 begins by providing one or more base components at step 302. The base component(s) are masked, as known in the art, and placed in a device such as a plasma chamber or magnetron for sputter cleaning and coating deposition. Typically, as known in the art, masking of components may be accomplished with a physical mask (such as stainless steel) that are fitted to the part in the region to be masked, or by using a polyimide such as Kapton®. One skilled in the art will recognize that masking of components may be accomplished by other known methods in the art.

Thus, at step 304 the component(s) are sputter cleaned using argon, and subsequent steps may thereby be performed by leaving the component(s) within the plasma chamber for coating deposition. Without breaking vacuum, a titanium layer is deposited at step 306 which serves as the source for titanium in the subsequent step 308, in which the component(s) are exposed to nitrogen and argon plasma in order to form titanium nitride 204 from reaction of nitrogen with the tungsten previously deposited at step 306. A titanium layer is again deposited at step 310 which serves as the source for titanium in the subsequent step 312 in which the component(s) are exposed to an oxygen and argon plasma in order to form titanium oxide 206 from reaction of oxygen with the tungsten previously deposited at step 310.

As stated, titanium nitride layer 204 can be formed in situ by first depositing titanium layer 208 using step 306. However, according to an alternate embodiment, a compound of titanium nitride is applied directly to base substrate 202. According to this embodiment, instead of first forming first titanium layer 208 during step 306, titanium nitride is directly applied to base substrate 202, foregoing step 306. As such, according to this invention, layer 208 of elemental titanium is not formed, since a source of titanium is not necessary during formation of layer 204, in this embodiment. Instead, titanium nitride is formed as layer 204 directly on base substrate 202.

Typically the same chamber or magnetron is used to perform all steps: 306-312. In addition and as stated, components may be sputter cleaned and then left within the same chamber or magnetron 212 for subsequent coating steps. As such, parts may be well cleaned and contamination may be avoided by not breaking vacuum between cleaning and material coating. Further, thickness of each layer is controlled by at least the amount of deposition time, while holding magnetron total power constant. Magnetron current and voltage are important deposition control parameters, which are in turn controlled by adjusting total pressure in the magnetron.

Typically the desired voltage to be applied is in the range of 300-500 V, above which arcing may occur. Typically also a total pressure ranging from 10-15 millitorr, perhaps as large a range as 5-20 millitorr, is used to control magnetron power. The rate of nitrogen and oxygen deposition, deposited in their respective steps, is also controlled by controlling the ratios of argon/nitrogen and argon/oxygen in their respective steps: 308 and 312, and according to one embodiment the ratio is 10:1 for each step 308 and 312. Flow rates of source gases nitrogen/argon during step 308 and oxygen/argon during step 312 is selected as a function of the pumping system, geometry of the surfaces to be coated, and the like, and may range from approximately 40-150 SSCM, according to embodiments of the invention.

As stated, embodiments of the invention may or may not include titanium in layers 208 and 210. Formation of layers 204 and 206 depends on the duration of exposure of the plasma during plasma steps 308 and 312. Thus, if steps 308 and 312 are performed for a long enough duration, all titanium in respective layers 208 and 210, which occurs during plasma steps 308 and 312, will be consumed and there will be no remaining titanium in its generally elemental form once the plasma exposure is complete. For example, as stated, titanium layer 208 is deposited on base substrate 202 during step 306. Subsequently, at step 308, a nitrogen and argon plasma is reacted with titanium layer 208, causing titanium nitride layer 204 to form by reacting nitrogen from the plasma with titanium from layer 208. If the process is performed for a long enough duration, all elemental titanium will be consumed, leaving only a layer of titanium nitride 204 but without layer 208 of elemental titanium 208. Similarly, layer 206 of titanium oxide likewise may be formed during step 312 by consuming all or only a portion of titanium layer 210 that is formed during step 310.

As such and as stated, embodiments of the invention having titanium nitride layer 204 formed on substrate 202, and titanium oxide layer 206 formed on titanium nitride layer 204, may or may not include additional titanium layers 208 and/or 210 as well. Titanium layers 208 and 210 may therefore be formed intentionally by controlling the duration of steps 308 and 312, or they may be formed as a residual remaining amount of elemental titanium that is not fully consumed during each respective coating step 308 and 312.

According to the invention, therefore, titanium oxide layer 206 may be formed having any thickness up to tens of microns, but preferably a thickness less than 5 microns, and according to one embodiment a thickness less than 1 micron. Similarly titanium nitride layer 204 may be formed having a controllable thickness as well. However, because the role of titanium nitride layer 204 is to provide a hard surface, its thickness may be greater, up to 100s of microns or more, and greater than 5 microns according to one embodiment.

Figure 5:
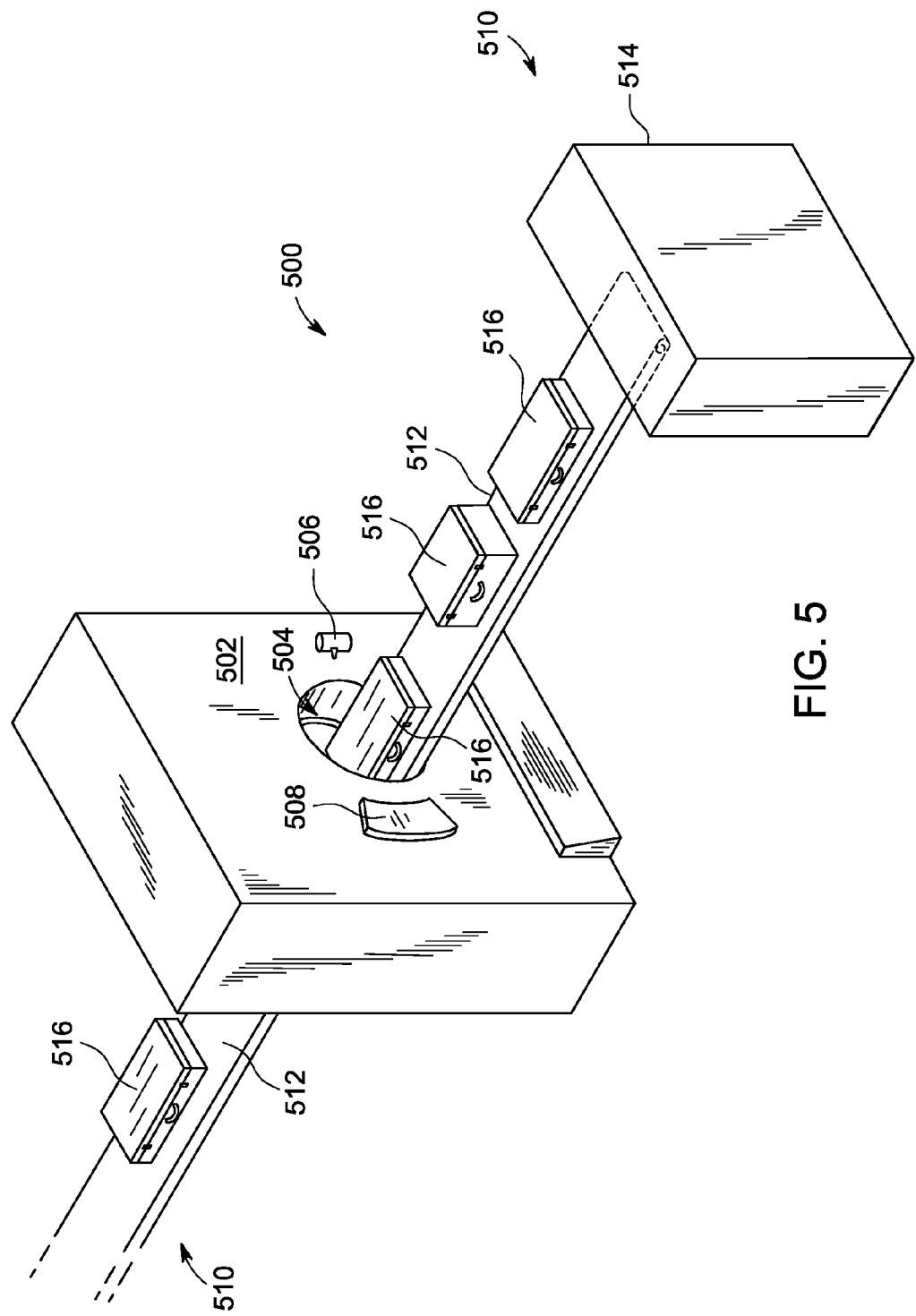
FIG. 5 is a pictorial view of an x-ray system for use with a non-invasive package inspection system incorporating embodiments of the invention.

FIG. 5 is a pictorial view of an x-ray system 500 for use with a non-invasive package inspection system. The x-ray system 500 includes a gantry 502 having an opening 504 therein through which packages or pieces of baggage may pass. The gantry 502 houses a high frequency electromagnetic energy source, such as an x-ray tube 506, and a detector assembly 508. A conveyor system 510 is also provided and includes a conveyor belt 512 supported by structure 514 to automatically and continuously pass packages or baggage pieces 516 through opening 504 to be scanned. Objects 516 are fed through opening 504 by conveyor belt 512, imaging data is then acquired, and the conveyor belt 512 removes the packages 516 from opening 504 in a controlled and continuous manner. As a result, postal inspectors, baggage handlers, and other security personnel may non-invasively inspect the contents of packages 516 for explosives, knives, guns, contraband, etc. One skilled in the art will recognize that gantry 502 may be stationary or rotatable. In the case of a rotatable gantry 502, system 500 may be configured to operate as a CT system for baggage scanning or other industrial or medical applications.

Thus, according to embodiments of the invention, a coating may be applied to base substrates of components of a spiral groove bearing that includes at least a first relatively hard layer of titanium nitride that is coated with a relatively softer oxygen-protective surface layer of titanium oxide. The coating maintains scratch resistance from the titanium nitride, even after high-temperature exposure, thereby enhancing robustness to dewpoint during hydrogen firing. This enables easier rework and re-use of bearing parts, as reworked or re-used bearing parts typically evolve more oxidizing $Ga_2O$ than a new or "green" bearing, which can subject known titanium nitride coatings to a risk of oxidation.

Therefore, according to one embodiment of the invention, an x-ray tube includes a frame enclosing a high vacuum, a cathode positioned within the enclosure, a bearing assembly a stationary component comprised of a first base substrate, the first base substrate having a first surface, a rotatable component comprised of a second base substrate, the second base substrate having a second surface, wherein the rotatable component is positioned proximate the stationary component such that a gap is formed between the first surface and the second surface, a liquid metal positioned within the gap, and an antiwetting coating attached to at least one of the first surface and the second surface, the coating includes titanium nitride attached to the at least one of the first surface and the second surface, and an oxide of titanium attached to the titanium nitride.

In accordance with another embodiment of the invention, a method of forming an antiwetting coating on a component of a spiral groove bearing includes depositing titanium nitride onto the component, and depositing titanium oxide onto the component after the titanium nitride has been deposited onto the component.

Yet another embodiment of the invention includes a spiral groove bearing (SGB) includes a stationary component and a rotatable component each having a respective base substrate and each having a layer comprised of an outer surface layer of titanium oxide, and titanium nitride positioned between a surface of each base substrate and each respective outer layer of titanium oxide, wherein a gap is formed between the stationary component and the rotatable component, and a liquid metal positioned in the gap, wherein the liquid metal comprises one of gallium and an alloy of gallium.

The invention has been described in terms of the preferred embodiment, and it is recognized that equivalents, alternatives, and modifications, aside from those expressly stated, are possible and within the scope of the appending claims.

What is claimed is:

1. An x-ray tube comprising:
    a frame enclosing a high vacuum;
    a cathode positioned within the frame; and
    a bearing assembly comprising:
        a stationary component comprised of a first base substrate, the first base substrate having a first surface;
        a rotatable component comprised of a second base substrate, the second base substrate having a second surface, wherein the rotatable component is positioned proximate the stationary component such that a gap is formed between the first surface and the second surface;
        a liquid metal positioned within the gap; and
        an antiwetting coating attached to at least one of the first surface and the second surface, the coating comprising:
            titanium nitride attached to the at least one of the first surface and the second surface; and
            an oxide of titanium attached to the titanium nitride.

2. The x-ray tube of claim 1 wherein one of the first base substrate and The second base substrate comprises molybdenum.

3. The x-ray tube of claim 1 wherein the oxide of titanium is less than 5 microns in thickness.

4. The x-ray tube of claim 1 wherein the oxide of titanium is less than 1 micron in thickness.

5. The x-ray tube of claim 1 wherein the titanium nitride is greater than 5 microns in thickness.

6. The x-ray tube of claim 1 wherein the coating comprises a layer of titanium positioned between the oxide of titanium and the titanium nitride.

7. The x-ray tube of claim 1 wherein the coating comprises a layer of titanium positioned between the titanium nitride and the at least one of the first surface and the second surface.

8. The x-ray tube of claim 1 wherein the stationary component is a center shaft that is stationary with respect to the frame.

9. The x-ray tube of claim 1 wherein the liquid metal comprises one of gallium and an alloy of gallium.

10. A method of forming an antiwetting coating on a component of a spiral groove bearing comprising:
   depositing titanium nitride onto the component; and
   depositing titanium oxide onto the component after the titanium nitride has been deposited onto the component.

11. The method of claim 10 comprising:
   providing the component having a base substrate;
   depositing titanium onto a surface of the base substrate of the component prior to depositing the titanium nitride onto the component;
   exposing the deposited titanium on the surface of the base substrate to a plasma comprising nitrogen to react the nitrogen with the deposited titanium on the surface of the base substrate to form the deposited titanium nitride;
   depositing titanium onto a surface of the deposited titanium nitride; and
   exposing the deposited titanium on the surface of the deposited titanium nitride to a plasma comprising oxygen to react the oxygen with the deposited titanium on the surface of the deposited titanium nitride to form the deposited titanium oxide.

12. The method of claim 10 comprising depositing titanium onto the component after depositing the titanium nitride but before depositing the titanium oxide onto the component.

13. The method of claim 10 comprising:
   positioning the component in a magnetron; and
   depositing the titanium nitride and the titanium oxide using the magnetron.

14. The method of claim 13 comprising:
   providing a compound that is comprised of titanium and nitrogen;
   wherein depositing the titanium nitride comprises depositing the compound of titanium and nitrogen using the magnetron.

15. The method of claim 13 comprising:
   argon sputtering the component in the magnetron to clean the component after the component is positioned in the magnetron but before depositing the titanium nitride and the titanium oxide.

16. A spiral groove bearing (SGB) comprising:
   a stationary component and a rotatable component each having a respective base substrate and each having a layer comprised of:
      an outer surface layer of titanium oxide; and
      titanium nitride positioned between a surface of each base substrate and each respective outer layer of titanium oxide, wherein a gap is formed between the stationary component and the rotatable component; and
   a liquid metal positioned in the gap, wherein the liquid metal comprises one of gallium and an alloy of gallium.

17. The SGB of claim 16 wherein each respective base substrate is comprised of molybdenum.

18. The SGB of claim 16 wherein each outer layer of titanium oxide is less than 5 microns in thickness.

19. The SGB of claim 18 wherein each outer layer of titanium oxide is less than 1 micron in thickness.

20. The SGB of claim 16 wherein each respective layer includes:
   a first layer of titanium positioned between the titanium nitride and its respective surface of the base substrate; and
   a second layer of titanium positioned between the titanium nitride and its respective outer surface of titanium oxide.

* * * * *